United States Patent
Chiu

(10) Patent No.: US 12,154,644 B2
(45) Date of Patent: Nov. 26, 2024

(54) TEST DEVICE AND TEST METHOD THEREOF

(71) Applicant: NANYA TECHNOLOGY CORPORATION, New Taipei (TW)

(72) Inventor: Yao-Chang Chiu, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 166 days.

(21) Appl. No.: 17/978,199

(22) Filed: Oct. 31, 2022

(65) Prior Publication Data

US 2024/0145024 A1    May 2, 2024

(51) Int. Cl.
*G11C 29/10*    (2006.01)
*G11C 29/50*    (2006.01)

(52) U.S. Cl.
CPC .............. *G11C 29/50* (2013.01); *G11C 29/10* (2013.01); *G11C 2029/5004* (2013.01)

(58) Field of Classification Search
CPC . G11C 29/50; G11C 29/10; G11C 2029/5004; G11C 29/021; G11C 29/12005
See application file for complete search history.

(56) References Cited

U.S. PATENT DOCUMENTS

| 7,715,260 B1* | 5/2010 | Kuo ...................... G11C 11/413 |
| | | 365/201 |
| 2015/0115929 A1* | 4/2015 | Seth ...................... G11C 5/147 |
| | | 323/303 |
| 2023/0402123 A1* | 12/2023 | Park ...................... G11C 29/36 |

FOREIGN PATENT DOCUMENTS

TW    I719841    2/2021

OTHER PUBLICATIONS

"Office Action of Taiwan Counterpart Application", issued on Jul. 3, 2024, p. 1-p. 8.

* cited by examiner

*Primary Examiner* — Mohammed A Bashar
(74) *Attorney, Agent, or Firm* — JCIPRNET

(57) ABSTRACT

A test device method includes: setting a core voltage of a memory device to a first voltage value and a peripheral voltage of the memory device to a second voltage value; testing the memory device by accessing the memory device based on the core voltage and the at least one peripheral voltage; adjusting the core voltage to a third voltage value and the at least one peripheral voltage of the memory device to a fourth voltage value; testing the memory device by reading the memory device based on the core voltage and the at least one peripheral voltage; adjusting the core voltage to a fifth voltage value and the at least one peripheral voltage of the memory device to a sixth voltage value; and testing the memory device by reading the memory device based on the core voltage and the at least one peripheral voltage.

18 Claims, 3 Drawing Sheets

TEST DEVICE AND TEST METHOD THEREOF

BACKGROUND OF THE INVENTION

Technical Field

The present invention generally relates to a test device and a test method thereof, and more particularly to the test method for verifying an impact of voltage effects on the memory device.

Description of Related Art

In a dynamic random access memory (DRAM), variation of operation voltages always affects performance of the DRAM. In a conventional art, it mostly relied on the analyst to spend a lot of time on test instrument from a test equipment, and test operation could not be interrupted during the test process (so as not to affect the results of the difference before and after).

However, in the early stage of product development, how to effectively shorten a verification time and analysis efficiency for the DRAM is extremely important to a designer, so a simple and fast verification method needs to be created.

SUMMARY OF THE INVENTION

The present invention provides a test device and a test method thereof which are used to quickly verify an impact of voltage effects on the memory device.

The test device method includes: setting a core voltage of a memory device to a first voltage value and a peripheral voltage of the memory device to a second voltage value; testing the memory device by accessing the memory device based on the core voltage with the first voltage value and the at least one peripheral voltage with the second voltage value; adjusting the core voltage to a third voltage value and the at least one peripheral voltage of the memory device to a fourth voltage value; testing the memory device by reading the memory device based on the core voltage with the third voltage value and the at least one peripheral voltage with the fourth voltage value; adjusting the core voltage to a fifth voltage value and the at least one peripheral voltage of the memory device to a sixth voltage value; and testing the memory device by reading the memory device based on the core voltage with the fifth voltage value and the at least one peripheral voltage with the sixth voltage value.

The test device includes a controller. The controller is configured to: set a core voltage of a memory device to a first voltage value and a peripheral voltage of the memory device to a second voltage value; test the memory device by accessing the memory device based on the core voltage with the first voltage value and the at least one peripheral voltage with the second voltage value; adjust the core voltage to a third voltage value and the at least one peripheral voltage of the memory device to a fourth voltage value; test the memory device by reading the memory device based on the core voltage with the third voltage value and the at least one peripheral voltage with the fourth voltage value; adjust the core voltage to a fifth voltage value and the at least one peripheral voltage of the memory device to a sixth voltage value; and, test the memory device by reading the memory device based on the core voltage with the fifth voltage value and the at least one peripheral voltage with the sixth voltage value.

In summary, the test device of present disclosure provides a test method for verifying a performance impact of a memory device by a low-voltage, normal-voltage, and a high-voltage conditions on the (Joint Electron Device Engineering Council) JEDEC specification. Test results of present disclosure can be provided for process analyzing, and a simple and quickly verification scheme can be created. Such as that, a verification time and analysis efficiency are enhanced for the memory device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
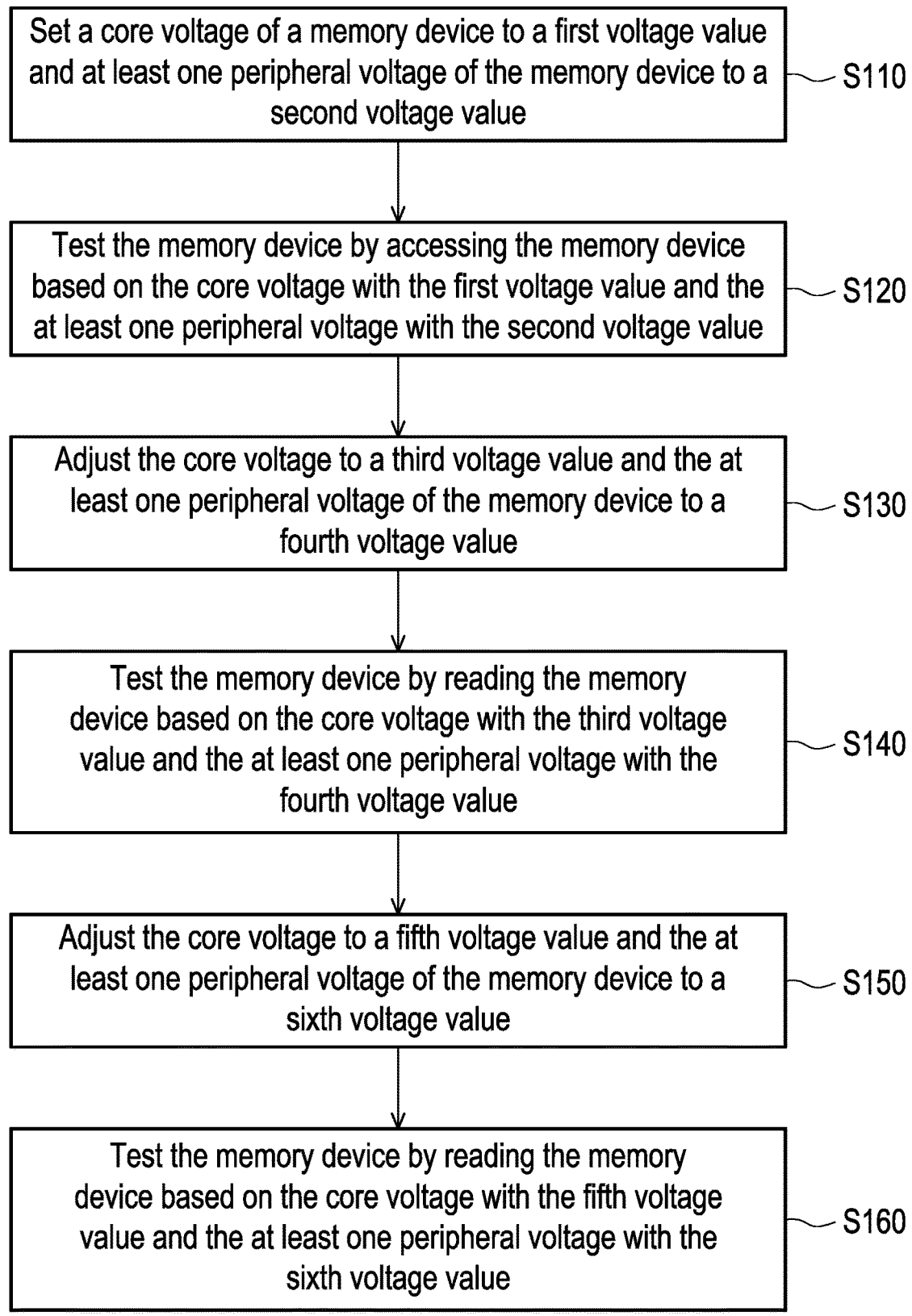
FIG. 1 illustrates a flow chart for a test method according to an embodiment of present disclosure.

Reference will now be made in detail to the present preferred embodiment of the invention, examples of which are illustrated in the accompanying drawings. Wherever possible, the same reference numbers are used in the drawings and the description to refer to the same or like parts.

Please refer to FIG. 1, which illustrates a flow chart for a test method according to an embodiment of present disclosure. In step S110, a core voltage of a memory device may be set to a first voltage value, and at least one peripheral voltage of the memory cell may be set to a second voltage value. In step S120, the memory device may be tested by accessing the memory device based on the core voltage with the first voltage value and the at least one peripheral voltage with the second voltage value. In detail, in the step S120, at least one test pattern may be written into a plurality of memory cells in a memory array of the memory device firstly, and then readout information can b obtained by reading all of the memory cells in the memory array of the memory device. Furthermore, a first test result may be generated by comparing the at least one test pattern with the readout information.

In this embodiment, the at least one test pattern may be preset and determined by a designer. Size and value of the at least one test pattern may be set by the designer without special limitation. For example, in one embodiment, number of the at least one test pattern may be 1. The one test pattern with 8 bits can be preset, and can be written into every 8 memory cells in the memory array repeatedly. The value of the test pattern may be 0x55, 0xAA in hex-decimal or any other value. In some embodiment, the number of the at least one test pattern may be larger than 1, and each of the test patterns may be generated by a counter. For example, if the counter is an up-counter, the test patterns may be, in hex-decimal, 0x00, 0x01, 0x02, 0x03 . . . etc. If the counter is a down-counter, the test patterns may be, in hex-decimal, 0xFF, 0xFE, 0xFD, 0xFC . . . etc.

In step S130, the core voltage is set to a third voltage value and the at least one peripheral voltage is set to a fourth voltage value. In this embodiment, the third voltage value is different from the first voltage value in the step S110, and the third voltage value may be smaller than the first voltage value. The fourth voltage value is different from the second voltage value in the step S110, and the fourth voltage value may be smaller than the second voltage value. In step S140, the memory device may be tested again by reading the memory device based on the core voltage with the third voltage value and the at least one peripheral voltage with the fourth voltage value. Also, a second test result may be generated by comparing the at least one test pattern written into the memory array in the step S110 with a readout data obtained by the step S140.

Please be noted here, the steps S130 and S140 may form a loop and can be repeatedly executed. In each loop, the core voltage may be decreased by a first step voltage and the at least one peripheral voltage may be decreased by a second step voltage. The first step voltage and the second step voltage may be different and may be set between 5 millivolts to 10 millivolts.

In step S150, the core voltage is set to a fifth voltage value and the at least one peripheral voltage is set to a sixth voltage value. In this embodiment, the fifth voltage value is different from the first voltage value in the step S110, and the fifth voltage value may be larger than the first voltage value. The sixth voltage value is different from the second voltage value in the step S110, and the sixth voltage value may be larger than the second voltage value. In step S160, the memory device may be tested again by reading the memory device based on the core voltage with the fifth voltage value and the at least one peripheral voltage with the sixth voltage value. Also, a third test result may be generated by comparing the at least one test pattern written into the memory array in the step S110 with a readout data obtained by the step S160.

Please be noted here, the steps S150 and S160 may form a loop and can be repeatedly executed. In each loop, the core voltage may be increased by a third step voltage and the at least one peripheral voltage may be increased by a fourth step voltage. The third step voltage and the fourth step voltage may be different and may be set between 5 millivolts to 10 millivolts.

By combining the first test result, the second test result and the third test result, an impact of voltage variation effects on the memory device can be verified. Such as that, process parameters for fabricating the memory device may be adjusted according to the impact of voltage variation effects, and a performance of the memory device can be enhanced.

It should be noted here, all of the steps S110 to S160 may be performed in a background mode. For the memory device embedded in an electronic device, the electronic device may set the background mode by executing program, and the steps S110 to S160 may be performed in the background mode according to a setting of the program. Such as that, the test method of present disclosure will not take up too much working time of electronic device, and the impact of the voltage variation effects can be quickly verified.

Figure 2:
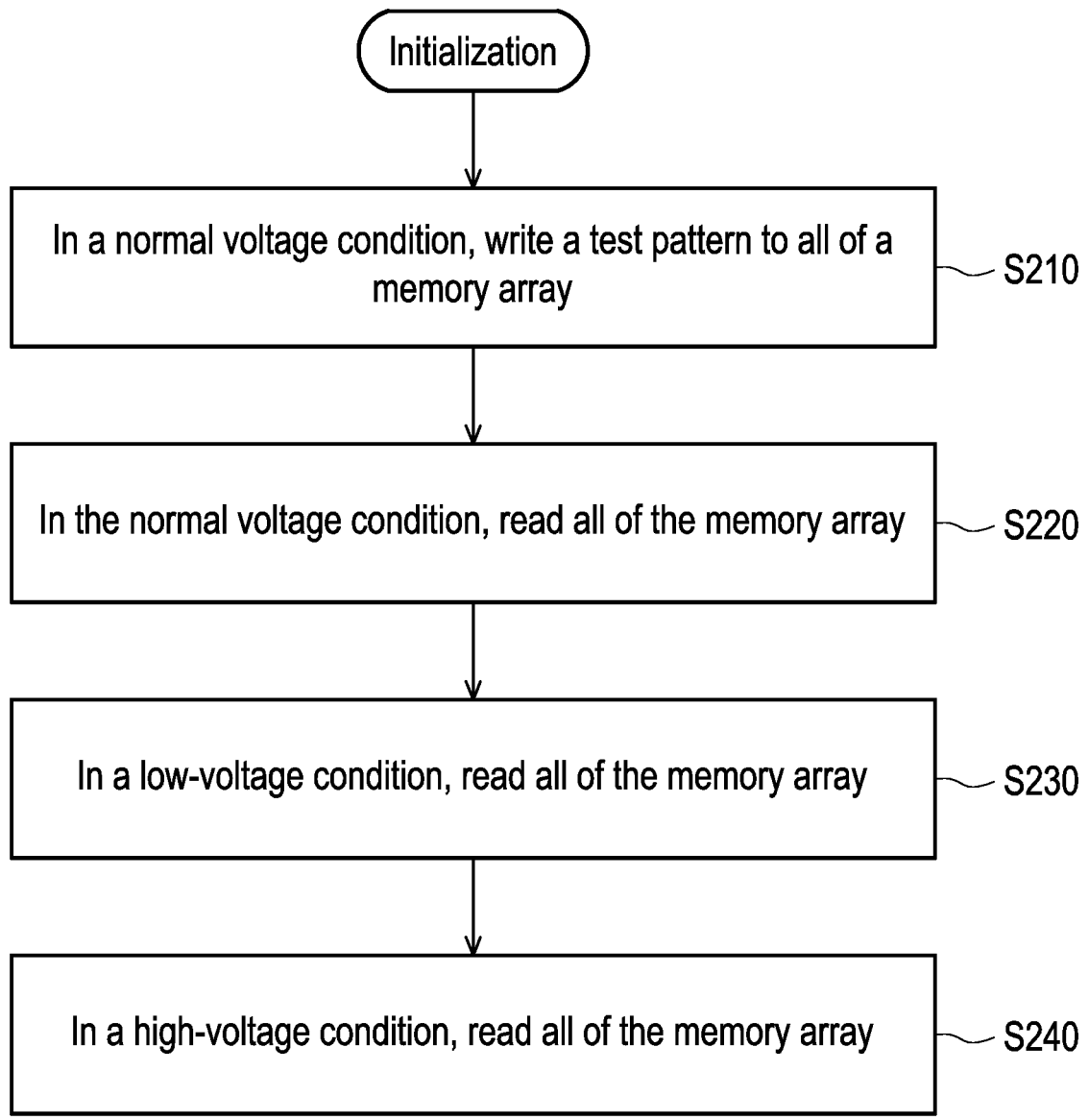
FIG. 2 illustrates a flow chart of a test method according to another embodiment of present disclosure.

Please refer to FIG. 2, which illustrates a flow chart of a test method according to another embodiment of present disclosure. In step S210, a memory device is set to a normal voltage condition, and a test pattern is written to all memory cells of a memory array. For example, in the normal voltage condition, a core voltage of the memory array of the memory device may be set to 0.6V, a first peripheral voltage of the memory array may be set to 1.8V and a second peripheral voltage the memory array may be set to 1.1V. Based on the core voltage, the first peripheral voltage and the second peripheral voltage, a preset test pattern may be written into all the memory cells of the memory array.

In step S220, in the normal voltage condition, read all the memory cells of the memory array, and redout information can be obtained. Furthermore, by comparing the redout information with the test pattern, a first test result can be obtained.

In step S230, the memory device is changed to a low-voltage condition. In the low-voltage condition, the core voltage of the memory array may be adjusted to 0.57V, the first peripheral voltage of the memory array may be set to 1.7V and the second peripheral voltage may be adjusted to 1.06V. Furthermore, in the step S230, by reading all the memory cells of the memory array based on the low-voltage condition, another redout information can be obtained.

By comparing the redout information obtained in the step S230 with the test pattern, a second test result can be obtained.

It should be noted here, the core voltage, the first peripheral voltage and the second peripheral voltage need not to be adjusted in place for one time. The first peripheral voltage and the second peripheral voltage may be adjusted step by step during a plurality of voltage adjusting steps, and the first peripheral voltage and the second peripheral voltage may be respectively adjusted by a plurality of step voltages in each of the voltage adjusting steps. Moreover, for each of the adjusting steps, all the memory cells of the memory array can be read and compared with the test pattern to obtain the second test result.

In step S240, the memory device is changed to a high-voltage condition. In the high-voltage condition, the core voltage of the memory array may be adjusted to 0.65V, the first peripheral voltage of the memory array may be set to 1.95V and the second peripheral voltage may be adjusted to 1.17V. Furthermore, in the step S240, by reading all the memory cells of the memory array based on the high-voltage condition, another redout information can be obtained.

By comparing the redout information obtained in the step S240 with the test pattern, a third test result can be obtained.

Of course, in the step S240, the core voltage, the first peripheral voltage and the second peripheral voltage also need not to be adjusted in place for one time. The first peripheral voltage and the second peripheral voltage may be adjusted step by step during a plurality of voltage adjusting steps, and the first peripheral voltage and the second peripheral voltage may be respectively adjusted by a plurality of step voltages in each of the voltage adjusting steps. Moreover, for each of the adjusting steps, all the memory cells of the memory array can be read and compared with the test pattern to obtain the third test result.

It should be noted here, all of the steps S210 to S240 may also be performed in a background mode. An electronic device may set the background mode by executing program to test a memory device, and the steps S210 to S240 may be performed in the background mode according to a setting of the program. Such as that, the test method of present disclosure will not take up too much working time of electronic device, and the impact of the voltage variation effects can be quickly verified.

Figure 3:
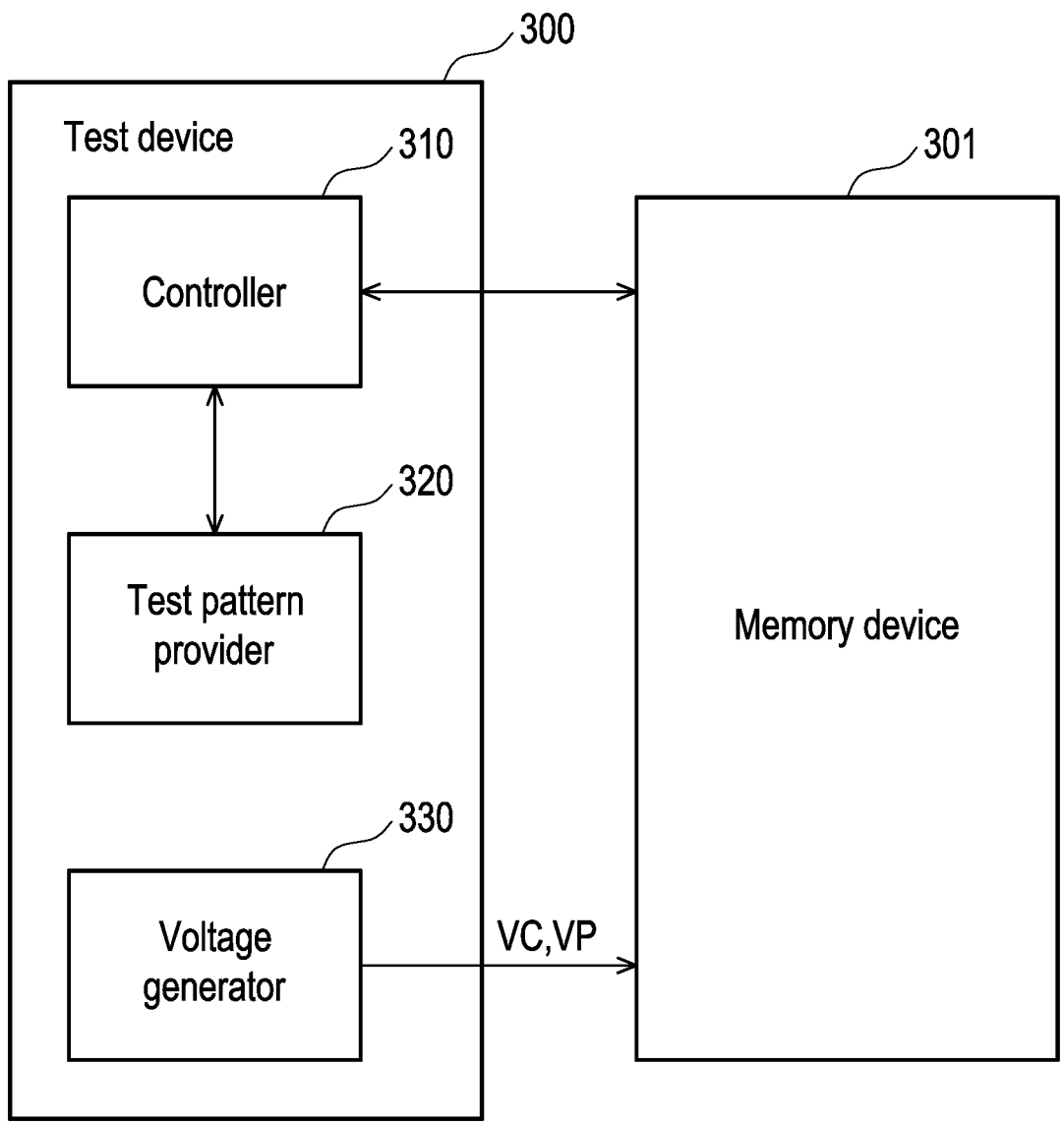
FIG. 3 illustrates a test device according to an embodiment of present disclosure.

Please refer to FIG. 3, which illustrates a test device according to an embodiment of present disclosure. The test device 300 is coupled to a memory device 301 which is under tested. The test device 300 includes a controller 310, a test pattern provider 310 and a voltage generator 230. The controller 310 may be coupled to the memory device 301.

The controller 310 is configured to perform the steps S110 to S160 or the steps S210 to S240 for testing the memory device 301. Detail of the steps S110 to S160 and the steps S210 to S240 have been described in the embodiments mentioned above, and no more repeated description here.

The controller 310 may be a processor having a computation function. Alternatively, the controller 310 may be a hardware circuit designed by using hardware description language (HDL) or any digital circuit design method well known by related technicians of the field, and implemented through a field programmable gate array (FPGA), a complex programmable logic device (CPLD) or an application-specific integrated circuit (ASIC).

The test pattern provider 320 is coupled to the controller 310. The test pattern provider 320 is used to provide at least one test pattern for testing the memory device 301. In one embodiment, the test pattern provider 320 may include a storage device for storing at least one preset test pattern, and providing the stored test pattern for testing the memory device 301. In another embodiment, the test pattern provider 320 may be a counter for generating the test patterns by performing counting operations. Furthermore, test pattern provider 320 may be a digital circuit for providing the test patterns according to a predetermined number sequence.

The voltage generator 330 is coupled to the memory device 330, and is configured to generate a core voltage VC and at least one peripheral voltage VP to the memory device 301. A core circuit of the memory device 301 receives the core voltage VC as an operation voltage, and at least one peripheral circuit of the memory device 301 receives the at least one peripheral voltage VP as an operation voltage. During test steps of present disclosure, the controller 310 may send command to the voltage generator 330 to adjust the core voltage VC and the at least one peripheral voltage VP.

The voltage generator 330 may be any type voltage regulating circuit well known by a person skilled in this art, and the voltage regulating circuit can adjust generated voltage according to external command.

In summary, the present disclosure provides a test method for testing a memory device in different voltage conditions. By reading the test pattern stored in the memory cells during different voltage conditions, and comparing readout information with the write-in test pattern, the test steps of the present disclosure may be performed in background, and an impact of voltage variation effects can be quickly verified. Such as that, process parameters of the memory device can be improved according to the impact of voltage variation effects, and performance of the memory device can be enhanced correspondingly.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A test method for a memory device, comprising:
    setting a core voltage of a memory device to a first voltage value and at least one peripheral voltage of the memory device to a second voltage value;
    testing the memory device by accessing the memory device based on the core voltage with the first voltage value and the at least one peripheral voltage with the second voltage value;
    adjusting the core voltage to a third voltage value and the at least one peripheral voltage of the memory device to a fourth voltage value;
    testing the memory device by reading the memory device based on the core voltage with the third voltage value and the at least one peripheral voltage with the fourth voltage value;
    adjusting the core voltage to a fifth voltage value and the at least one peripheral voltage of the memory device to a sixth voltage value; and
    testing the memory device by reading the memory device based on the core voltage with the fifth voltage value and the at least one peripheral voltage with the sixth voltage value,
    wherein the third voltage value is smaller than the first voltage value, and the fourth voltage value is smaller than the second voltage value.

2. The test method according to claim 1, wherein the fifth voltage value is larger than the first voltage value.

3. The test method according to claim 1, wherein the sixth voltage value is larger than the second voltage value.

4. The test method according to claim 1, wherein the core voltage is smaller than the at least one peripheral voltage.

5. The test method according to claim 1, wherein a step of testing the memory device by accessing the memory device based on the core voltage with the first voltage value and the at least one peripheral voltage with the second voltage value comprises:
    writing at least one test pattern to all of a plurality of memory cells of a memory array of the memory device;
    reading all of the plurality of memory cells of the memory array to obtain readout information; and
    generating a test result by comparing the at least one test pattern with the readout information.

6. The test method according to claim 1, wherein a step of adjusting the core voltage to the third voltage value and the at least one peripheral voltage of the memory device to the fourth voltage value comprises:
    decreasing the core voltage from the first voltage by a first step voltage, and decreasing the at least one peripheral voltage from the second voltage by a second step voltage.

7. The test method according to claim 6, wherein each of the first step voltage and the second step voltage is between 5 millivolts to 10 millivolts.

8. The test method according to claim 6, wherein a step of adjusting the core voltage to the fifth voltage value and the at least one peripheral voltage of the memory device to the sixth voltage value comprises:
    increasing the core voltage from the third voltage by a third step voltage, and increasing the at least one peripheral voltage from the fourth voltage by a fourth step voltage.

9. The test method according to claim 8, wherein each of the third step voltage and the fourth step voltage is between 5 millivolts to 10 millivolts.

10. A test device for testing a memory device, comprising:
    a controller, coupled to the memory device, wherein the controller is configured to:
        set a core voltage of a memory device to a first voltage value and a peripheral voltage of the memory device to a second voltage value;
        test the memory device by accessing the memory device based on the core voltage with the first voltage value and the at least one peripheral voltage with the second voltage value;

adjust the core voltage to a third voltage value and the at least one peripheral voltage of the memory device to a fourth voltage value;

test the memory device by reading the memory device based on the core voltage with the third voltage value and the at least one peripheral voltage with the fourth voltage value;

adjust the core voltage to a fifth voltage value and the at least one peripheral voltage of the memory device to a sixth voltage value; and test the memory device by reading the memory device based on the core voltage with the fifth voltage value and the at least one peripheral voltage with the sixth voltage value, wherein the third voltage value is smaller than the first voltage value, and the fourth voltage value is smaller than the second voltage value.

11. The test device according to claim 10, wherein the fifth voltage value is larger than the first voltage value.

12. The test device according to claim 10, wherein the sixth voltage value is larger than the second voltage value.

13. The test device according to claim 10, wherein the core voltage is smaller than the at least one peripheral voltage.

14. The test device according to claim 10, wherein the controller is further configured to:

write a test pattern to all of a plurality of memory cells of a memory array of the memory device;

read all of the plurality of memory cells of a memory array to obtain readout information; and generate a test result by comparing the at least one test pattern with the readout information.

15. The test device according to claim 10, wherein the controller is further configured to:

decrease the core voltage from the first voltage by a first step voltage, and decreasing the at least one peripheral voltage from the second voltage by a second step voltage.

16. The test device according to claim 15, wherein the controller is further configured to:

increase the core voltage from the third voltage by a third step voltage, and increasing the at least one peripheral voltage from the fourth voltage by a fourth step voltage.

17. The test device according to claim 10, further comprising:

a voltage generator, coupled to controller, providing the core voltage and the at least one peripheral voltage.

18. The test device according to claim 10, further comprising:

a test pattern provider, coupled to the controller, for providing the at least one test pattern.

* * * * *